Figure 1:
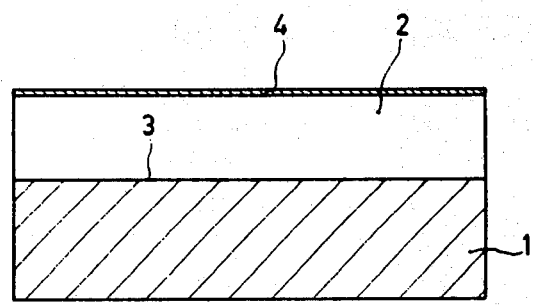

United States Patent
Hallais et al.

[11] 3,966,513
[45] June 29, 1976

[54] METHOD OF GROWING BY EPITAXY FROM THE VAPOR PHASE A MATERIAL ON SUBSTRATE OF A MATERIAL WHICH IS NOT STABLE IN AIR

[75] Inventors: Jean Philippe Hallais, Paris; Alain Humbert, Plessis Trevise; Claude Schemali, Paris, all of France

[73] Assignee: U.S. Philips Corporation, New York, N.Y.

[22] Filed: Feb. 8, 1974

[21] Appl. No.: 440,717

[30] Foreign Application Priority Data
Feb. 13, 1973  France .................. 73.05049

[52] U.S. Cl. .................. 148/175; 148/1.5; 148/172; 148/174
[51] Int. Cl.² .................. H01L 7/36
[58] Field of Search ........... 148/175, 174, 172, 1.5; 427/64

[56] References Cited
UNITED STATES PATENTS

| | | | |
|---|---|---|---|
| 3,312,570 | 4/1967 | Ruchrwein | 148/175 |
| 3,322,575 | 5/1967 | Ruchrwein | 148/175 |
| 3,393,103 | 7/1968 | Hellbardt et al. | 148/175 |
| 3,428,500 | 2/1969 | Maeda | 148/175 |
| 3,429,756 | 2/1969 | Groves | 148/175 |
| 3,647,581 | 3/1972 | Mash | 148/175 |
| 3,677,846 | 7/1972 | Theunissen et al. | 148/175 |

*Primary Examiner*—Walter R. Satterfield
*Attorney, Agent, or Firm*—Frank R. Trifari; Norman N. Spain

[57] ABSTRACT

A method of epitaxially growing a monocrystalline layer on a substrate that is oxidizable in air in which an epitaxial layer of the oxidizable material is grown on a support of a monocrystalline material having the desired crystalline structure, enough of the support material is then removed to enable removal by etching of the support from the layer of the oxidizable material, the support and attached layer are then introduced into a non-oxidizing atmosphere where the support is etched away from the layer of the oxidizable material and a monocrystalline layer of another material is grown by epitaxial deposition on the exposed surface of the surface of the layer of the oxidizable material exposed by etching.

8 Claims, 4 Drawing Figures

METHOD OF GROWING BY EPITAXY FROM THE VAPOR PHASE A MATERIAL ON SUBSTRATE OF A MATERIAL WHICH IS NOT STABLE IN AIR

The present invention relates to a method of growing by epitaxy from the vapour phase a material on a substrate of a material which is not stable in air.

The present invention also relates to semiconductor plates manufactured by said method.

In the technology of especially the semiconductors, epitaxy from the vapour phase is usually realised by growth on a substrate which consists of a plate cut from a solid monocrystalline block of semiconductor material. In certain cases, however, the substrate is epitaxial, that is to say has been obtained itself by epitaxial growth on a first monocrystalline semiconductor substrate.

It may occur that a semiconductor substrate is covered in air by a thin adhering oxide layer which is difficult to remove and which makes the growth of a semiconductor material on said substrate by epitaxy from the vapour phase impossible.

This is the case especially when the substrate is a semiconductor compound which contains the element aluminum in addition to at least one other element, the element aluminum actually oxidizing when in contact with air and providing a complex aluminum oxide layer on which it is substantially impossible to perform an epitaxial growth.

The semiconductor compounds of this type include inter alia, for example, gallium aluminum arsenide, aluminum arsenide and aluminum phosphide.

One of the objects of the present invention is to mitigate this difficulty.

The present invention takes into consideration the fact that it is possible to protect an epitaxial layer of a material which is not stable in air by means of the base support on which it has been manufactured.

The present invention relates to a method of growing by epitaxy from the vapour phase a material on a substrate of a material which is not stable in air and is characterized in that a layer of the said nonstable material is grown by epitaxy on a support of a monocrystalline material having a suitable crystal structure after which the thickness of the said support is reduced to a very small value. The plate which consists of the said support and the said layer is then introduced into a suitable non-oxidizing atmosphere, the remaining layer of the said support is removed by etching, and finally a monocrystalline layer of the said material is grown by epitaxy from the vapour phase on the face of the layer of non-stable material exposed by the etching.

Etching in the reactor is preferably carried out in the vapour phase.

This method has first of all the advantage of being simple and requiring no extra or complicated treatments. The method permits the epitaxial growth on bodies on which so far an uninterrupted epitaxial and homogeneous layer could not possibly be provided or could be provided with difficulty only.

For example, an epitaxial growth of a ternary semiconductor material, for example gallium indium arsenide (Ga,In)As, on a monocrystalline substrate of ternary semiconductor material, for example gallium aluminum arsenide (Ga,Al)As, is possible.

It is to be noted that the choice of the material of the substrate has often to be made from a small number of possibilities. The choice is restricted by a number of limitations, certain of which relate to the epitaxy itself, for example, by the lattice constants, by the possibility of obtaining the substrate itself and the mechanical properties thereof and of which other relate to the possible use of plates, in particular when optoelectronic elements are concerned.

Although the lattice constant of (Ga,Al)As and of (Ga,In)As permit as such an epitaxy of one on the other, the impossibility of obtaining (Ga,Al)As other than as an epitaxial layer on Ga, As makes the solution of this problem difficult.

Up till now, said material could be obtained with difficulty only as a substrate because it was covered in air with an adhering layer of complex aluminum oxide.

It is inter alia just to this problem to which the present invention provides a solution.

According to the present invention, the growth of a layer of gallium indium arsenide (Ga,In)As on a substrate of gallium aluminum arsenide (Ga,Al)As is carried out by starting from a support of a semiconductor material of the III–V type, for example gallium arsenide GaAs, on which a layer of gallium aluminum arsenide (Ga,Al)As is grown by epitaxy. The thickness of the gallium arsenide support is then reduced to a very small value. The plate which consists of the support of gallium arsenide (GaAs) and the said layer of gallium aluminum arsenide (Ga,Al)As is introduced into a suitable non-oxidizing atmosphere. By etching in the said atmosphere the remaining layer is then removed from the said support of gallium arsenide GaAs and a monocrystalline layer of gallium indium-arsenide (Ga,In)As is then grown on the thus exposed side of the layer of gallium aluminum arsenide (Ga,Al)As by epitaxy from the vapour phase.

The gallium aluminum arsenide (Ga,Al)As has a lattice constant which shows only a small deviation with respect to that of gallium indium arsenide (Ga, In)As. Hence an active layer of gallium indium arsenide (Ga,In)As of an excellent crystal quality can be obtained and the assembly of the semiconductor materials gallium aluminum arsenide (Ga,Al)As and gallium indium arsenide (Ga,In)As is particularly suitable to manufacture transmission photocathodes.

It is already known to manufacture devices by providing one or more epitaxial layers on a monocrystalline substrate which is then removed either partly or entirely. In particular French Pat. No. 70.46399 filed on Dec. 23, 1970 in the name of R.T.C. La Radiotechnique-Compelec and entitled "Semiconductor device and method of manufacturing same" describes a device which is formed starting from an epitaxial monocrystalline semiconductor substrate which consists of a support of the III–V type which may consist of gallium arsenide, and a monocrystalline epitaxial layer of a ternary compound, for example (Ga,Al)As, on the free face of which a semiconductor material of the III–V type is grown which may also be gallium arsenide.

With a view to inverting the concentration gradient of the ternary layer with respect to the free face of the same and thus using the better optical conditions, the monocrystalline support in this application is removed and the last deposited layer is used as a mechanical support and the ternary layer as an active part.

In the present invention the support is removed entirely from an epitaxial plate and instead of this the desired monocrystalline layer of semiconductor material is deposited by epitaxy from the vapour phase exposed on the face of the epitaxial layer by eliminating the initial support. The mechanical rigidity is then obtained by the epitaxial layer which has become a substrate.

The invention will be described in greater detail with reference to the accompanying drawing. The description relates to the manufacture of a plate formed by a layer of gallium indium arsenide (Ga,In)As on a layer of gallium aluminum arsenide (Ga,Al)As.

FIGS. 1, 2, 3 and 4 show the plate of semiconductor material in various stages during its manufacture.

In order to facilitate the understanding of the text, the same reference numerals will be used for the same components in the various figures. The thicknesses of the various layers of the device are exaggerated and their proportions are not respected for clearness' sake.

FIG. 1 shows a monocrystalline support 1 which preferably consists, for example, of gallium arsenide and which is cut out of a solid monocrystalline block. A layer 2 of a semiconductor material which is not stable in air is grown on said support 1 according to known methods by epitaxy from the liquid phase, which layer 2 in the example described is gallium aluminum arsenide (Ga,Al)As and on which the epitaxial deposit of the desired semiconductor material is grown. The respective thicknesses for the support 1 may be, for example, between 50 $\mu m$ and 1 $mm$ (said thickness is not so important because the said support is removed during the subsequent treatments) and for the layer of non-stable material 2 between 10 $\mu m$ and 500 $\mu m$. Reference numeral 3 denotes the common face between the support 1 and the non-stable layer 2 of material. The non-stable material 2 is rapidly covered with a layer of complex oxides 4 in an oxidizing atmosphere.

Figure 2:
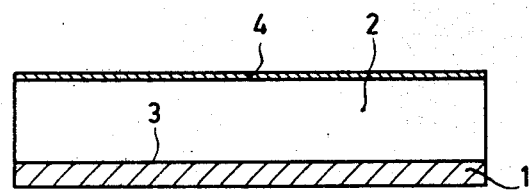

FIG. 2 shows the plate after reduction of the thickness of the support 1. The thickness of the nonstable material 2 and the layer of complex oxides 4 is not changed, while the thickness of the support 1 has been reduced to a value in the order of 10 microns (from 5 to 15 $\mu$) through known means, for example, a mechanical-chemical polishing.

The plate is then introduced into a nonoxidizing atmosphere in a reactor, if desired by inverting it to facilitate the subsequent treatments.

Figure 3:
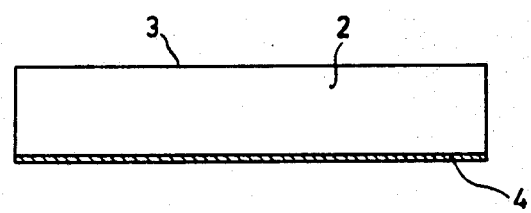

The remaining layer of the support 1 is then etched until it has been removed entirely and the plate shown in FIG. 3 has been obtained. Etching is carried out by means of known methods, for example chemically, by means of a gaseous hydrogen halide, for example, hydrogen chloride HCl.

This hydrogen chloride acid can preferably be obtained inside the reactor by decomposition of arsenic trichloride $AsCl_3$ and reaction with hydrogen; this results in a dilute hydrogen chloride with a partial pressure in the order of $3.10^{-2}$ atmosphere and more generally between 0.5 and $5.10^{-2}$ atmosphere. Etching is carried out at a temperature in the order of 700°C, more generally at a temperature between 650° and 750°C, the etching rate is then between 0.5 and 3 microns per minute. In this manner the face 3 of the layer of non-stable material is exposed.

A layer of semiconductor material 5, for example, gallium indium arsenide, whose thickness may be between 0.5 and 10 $\mu$ is then grown on the thus exposed face 3 by epitaxial growth from the vapour phase.

The said epitaxy from the vapour phase may preferably be carried out by the so-called trichloride method according to which arsenic trichloride $AsCl_3$ is decomposed to produce hydrochloric acid which by reaction with a gallium-source permits of obtaining gallium arsenide and in the same manner by reaction with an indium source permits of obtaining indium arsenide InAs.

The said epitaxy may preferably be realized at the same temperature as that used for etching, which forms one of the advantages of the present invention.

Figure 4:
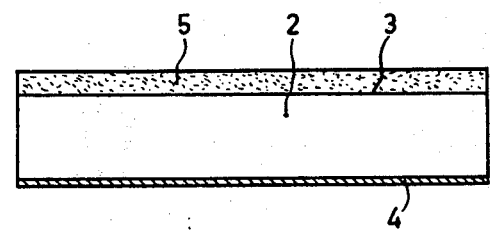

In this manner and in similar circumstances plates may be obtained of which one is shown in FIG. 4. It comprises an active layer 5 of semiconductor material of gallium indium arsenide (Ga,In)As which has been deposited epitaxially on a substrate 2 of gallium aluminum arsenide (Ga,Al)As which comprises on its upper part a layer 4 of complex aluminum oxides which is very stable and very readily adhering.

The presence of the layer of complex aluminum oxides provides the advantage that the second face of the substrate of gallium aluminum arsenide (Ga,Al)As is protected and that a non-desired epitaxial growth of gallium indium arsenide on said face is avoided. In certain cases and in order to reinforce the layer of complex aluminum oxides, same is covered with silicon oxide.

The last-mentioned plates may be used for transmission photocathodes.

What is claimed is:

1. A method of epitaxially growing a monocrystalline layer of a first material from the vapor phase on an oxide free surface of a substrate of a second material oxidizable in air, said method comprising epitaxially growing a layer of said second material on a support of a monocrystalline material having the desired crystalline structure, reducing the thickness of said support to a value sufficiently less than the thickness of the layer of said second material to enable removal by etching of said support from the layer of said second material, introducing said support and attached layer of said second material into a non-oxidizing atmosphere and then, while in said non-oxidizing atmosphere, subjecting said support and attached layer of said second material to the action of an etch for a time sufficient to cause complete removal of said support but insufficient to cause complete etching of the layer of said second material thereby leaving exposed the surface of the layer of said second material previously attached to said support and growing, by epitaxial deposition from the vapor phase, a monocrystalline layer of said first material on the surface of said second material exposed by etching.

2. A method as claimed in claim 1, characterized in that etching is carried out with a gaseous etchant.

3. The method of claim 2 wherein the first material is gallium indium arsenide, the second material is gallium aluminum arsenide and the monocrystalline material is gallium arsenide.

4. A method as claimed in claim 3 characterized in that before etching the value of the thickness of the support of gallium arsenide is between 5 and 10 microns.

5. A method as claimed in claim 3, characterized in that the chemical atmosphere contains gaseous hydrogen halide having a partial pressure between 0.5 and $5.10^{-2}$ atmosphere.

6. A method as claimed in claim 5, characterized in that the temperature at which etching is carried out is between 650° and 750°C.

7. A method as claimed in claim 3, characterized in that the step of epitaxially growing from the vapour phase of galliumindiumarsenide (Ga,In)As is carried out at a temperature between 650° and 750°C.

8. A method as claimed in claim 6, characterized in that the temperature at which the chemical etching is carried out and the temperature of the step of epitaxially growing from the vapour phase are the same.

* * * * *